United States Patent
Soma

(10) Patent No.: US 7,324,021 B2
(45) Date of Patent: Jan. 29, 2008

(54) INPUT DEVICE

(75) Inventor: Masahiro Soma, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 172 days.

(21) Appl. No.: 11/352,572

(22) Filed: Feb. 13, 2006

(65) Prior Publication Data

US 2006/0187090 A1   Aug. 24, 2006

(30) Foreign Application Priority Data

Feb. 23, 2005   (JP) ............................ 2005-046985

(51) Int. Cl.
*H03M 11/00* (2006.01)
(52) U.S. Cl. .................. 341/33; 367/112; 345/168
(58) Field of Classification Search .................. 341/20, 341/22, 33, 26; 345/168; 307/112
See application file for complete search history.

(56) References Cited

U.S. PATENT DOCUMENTS 3,668,698 A * 6/1972 Demirdjioghlou et al. .... 341/33
4,543,564 A * 9/1985 Audoin et al. ................ 341/24
4,772,874 A * 9/1988 Hasegawa ..................... 341/26

FOREIGN PATENT DOCUMENTS

JP    2004-201175    7/2004

* cited by examiner

*Primary Examiner*—Albert K. Wong
(74) *Attorney, Agent, or Firm*—Brinks Hofer Gilson & Lione

(57) ABSTRACT

An input device includes a plurality of input keys arranged in a matrix of three or more rows and three or more columns; electrodes facing parts of or all surfaces of the input keys that surround intersection of rows and columns formed by the arrangement of the input keys; and an input key detecting unit that identifies operated input keys among the plurality of input keys by combinations of the electrodes having a change in electrostatic capacitance. With this structure, the number of electrodes can be less than that of the input keys.

3 Claims, 5 Drawing Sheets

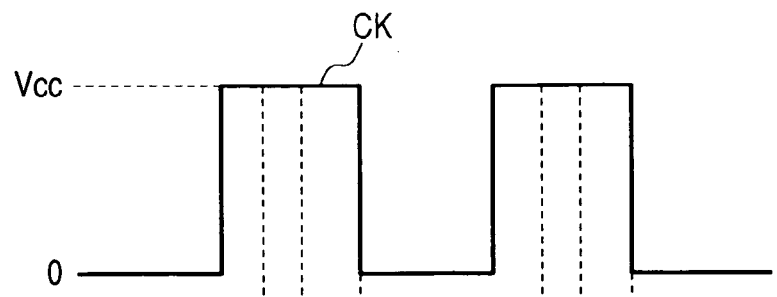
FIG. 5A
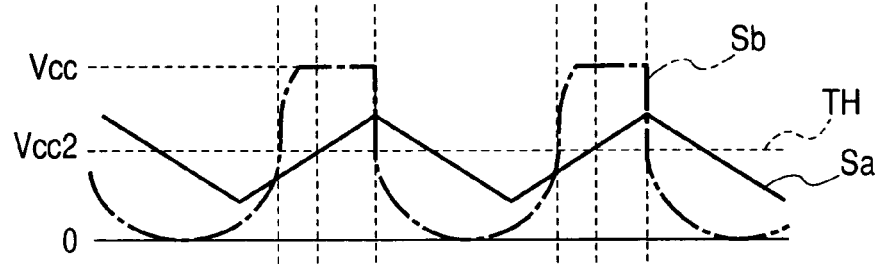
FIG. 5B
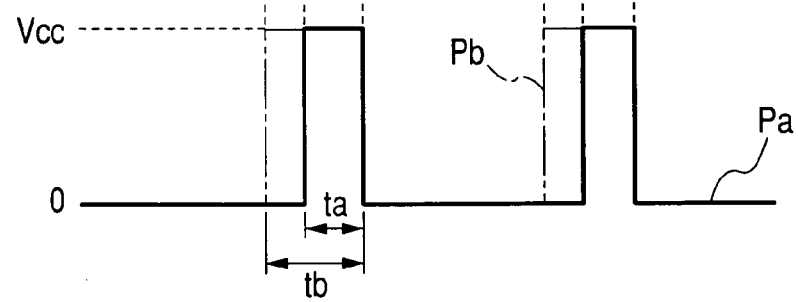
FIG. 5C
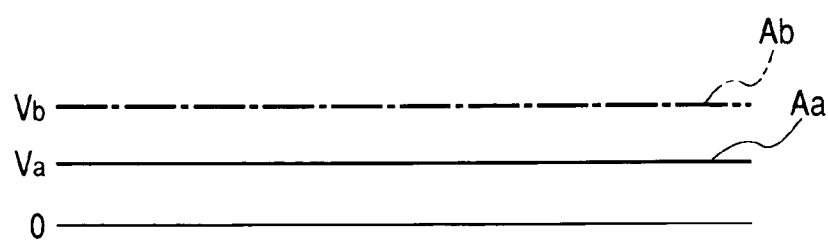
FIG. 5D
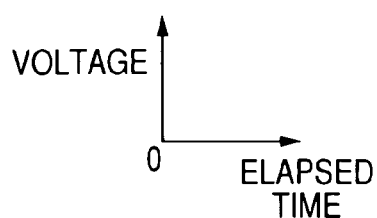

INPUT DEVICE

BACKGROUND OF THE INVENTION

1. Field of the Invention

The present invention relates to an input device, and more particularly, to an input device which is suitable for a small portable terminal or the like having a plurality of input keys.

2. Description of the Related Art

Generally, an input device having a plurality of input keys has been widely used in numerical keypads such as keyboard of a personal computer, electronic calculator, mobile phone or the like. Even though there are various types of input devices having different inputting modes, input devices that rely on the changes in electrostatic capacitance can be used due to the capability of reducing the size and cost as compared to the other types of input devices.

The input device that relies on the changes in electrostatic capacitance is composed of input keys printed on a top sheet, flat electrodes disposed in a position facing the input keys, and a controller for detecting the change in electrostatic capacitance of the electrodes. In addition, if the controller detects the change in electrostatic capacitance of the electrodes generated when an operator approaches or touches the input keys, the input device can input desired keys.

However, in the input device that relies on the change in electrostatic capacitance, since the input keys face the electrodes, and thus the number of the input keys is equal to that of the electrodes, the increase in the number of the input keys will cause the following three setbacks.

The first problem is the forming of the electrodes and the conductive wires. If the number of the input keys increases, the number of the conductive wires connected to the electrodes also increases by the increased number of the electrodes as well as the electrodes facing the input keys. Accordingly, if the increased number of input keys are formed on a substrate having the same area as the existing substrate, the electrodes and conductive wires are be formed smaller so as to fit in the area. In addition, as the area of the substrate becomes smaller, the electrodes are decreased in size and the conductive wires are made thin. Thus, this problem makes it difficult to form the input device.

The second problem is the reduction in size of the substrate. When the number of the input keys increases, if electrodes having the same area as the existing electrodes and conductive wires are formed, the substrate on which the electrodes and the conductive wires are formed is enlarged. Thus, this problem makes it difficult to make the input device slim.

The third problem is the increase in manufacturing cost, which results from the first problem. As described in the first problem, it is very difficult to form the electrodes and the conductive wires when the number of the input keys increases unless the substrate is enlarged. That is, a sophisticated technique is required to form small electrodes and thin conductive wires, thus consequentially increasing the manufacturing cost of the input device. In other words, the smaller the area of the substrate becomes, the higher the cost of manufacturing becomes.

SUMMARY OF THE INVENTION

The present invention has been finalized in view of the drawbacks inherent in the related art, and it is an object of the invention to provide an input device in which electrodes and conductive wires are easily formed even though the number of input keys increases or a substrate having the electrodes formed thereon is made small.

In order to achieve the above-described objects, according to a first aspect of the invention, an input device includes a plurality of input keys arranged in a matrix having three or more rows and three or more columns; electrodes facing parts of or all surface of the input keys that surround intersections of rows and columns formed by the arrangement of the input keys; and an input key detecting unit that identifies operated input keys among the plurality of input keys depending on combinations of the electrodes having a change in electrostatic capacitance.

According to a second aspect of the invention, the input key detecting unit includes a clock signal generating unit that generates clock signals; a delay unit that performs delay processing on the clock signals according to the electrostatic capacitance of the electrodes when a human body approaches or contacts the input keys; a logical conjunction unit that inputs delayed clock signals and non-delayed clock signals and outputs output signals according to a delayed amount of the delayed clock signals; a smoothing unit that smoothes output signals of the logical conjunction unit such that the output signals become analog signals; an A/D conversion unit that converts the analog signals to digital signals; and a controller that identifies input keys, when the human body approaches or contacts, by combinations of the digital signals.

According to a third aspect of the invention, the electrodes have non-touch sensitive parts, which do not respond to operation of the input keys, in positions not facing the input keys.

According to the main aspect of the invention, parts in which the electrodes and the conductive wires are formed can be made small, and the electrodes and the conductive wires are easily formed even though the number of input keys increases or a substrate having the electrodes formed thereon is made small. With this structure, the electrodes and the conductive wires are easily formed, which make it possible to reduce the manufacturing cost of the input device.

According to the other aspects of the invention, it is possible to prevent malfunctions due to unintended input where the input keys are not formed.

BRIEF DESCRIPTION OF THE DRAWINGS

FIG. 5 contains graphs showing a change in electrostatic capacitance of the electrodes according to the present embodiment; FIG. 5A is a graph of clock signals, FIG. 5B is a graph of clock signals output from a delay unit, FIG. 5C is a graph of clock signals output from a logical conjunction unit, and FIG. 5D is a graph of output signals output from a smoothing unit.

DESCRIPTION OF THE PREFERRED EMBODIMENT

Hereinafter, an input device according to an example of an embodiment of the present invention will be described with reference to FIGS. 1 to 5.

Figure 1:
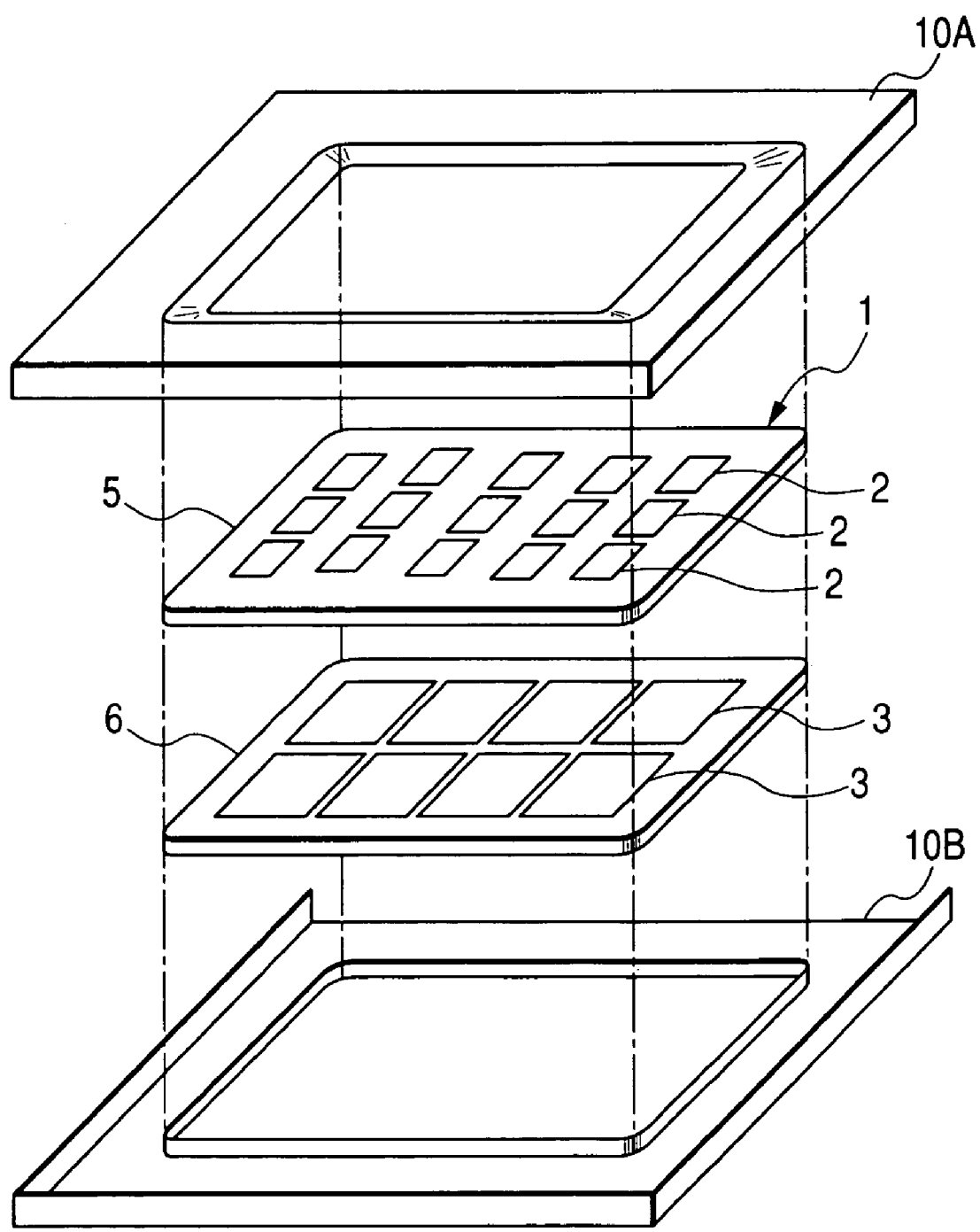
FIG. 1 is a conceptual perspective view showing an example of an input device according to an embodiment of the invention.
Figure 2:
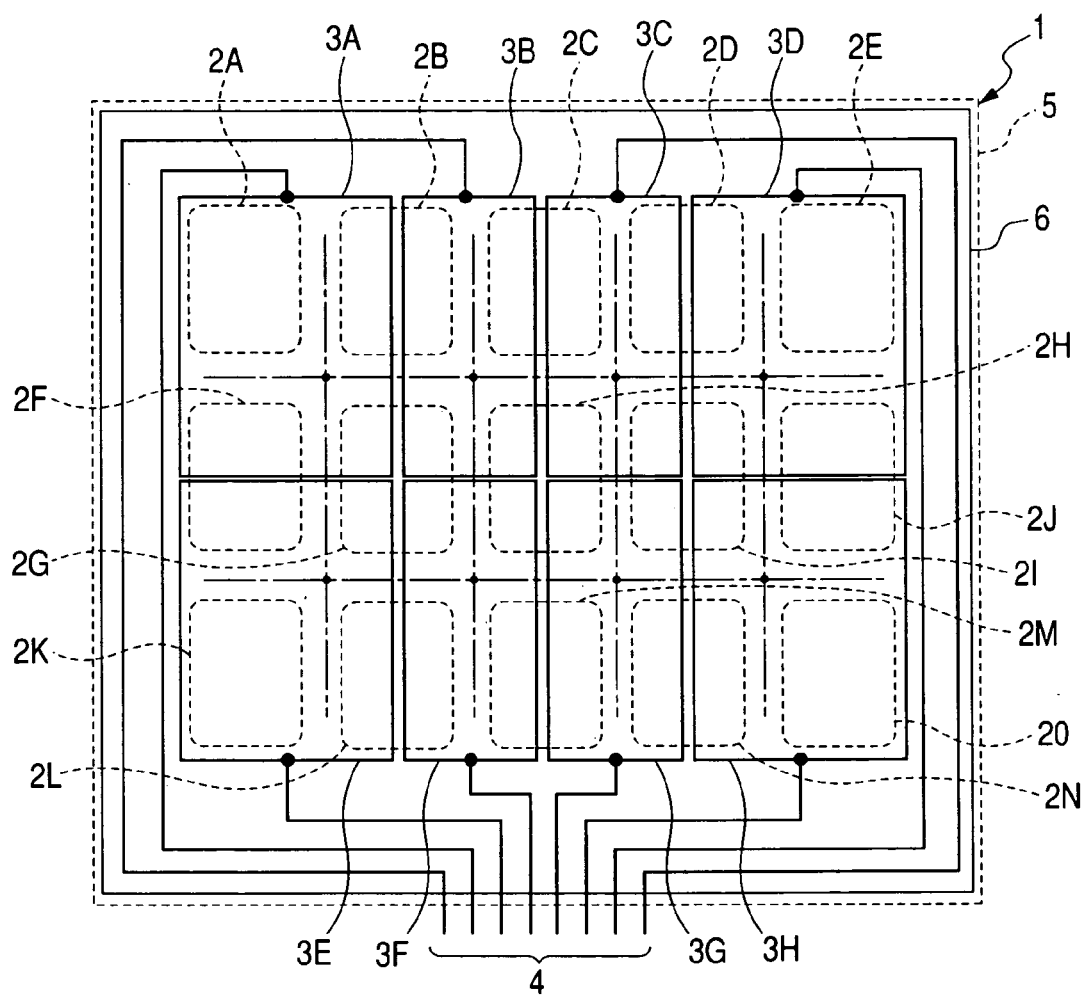
FIG. 2 is a front view showing an example of molded patterns of electrodes and conductive wires formed on a substrate when an input key of the input device of the invention is arranged.
Figure 3:
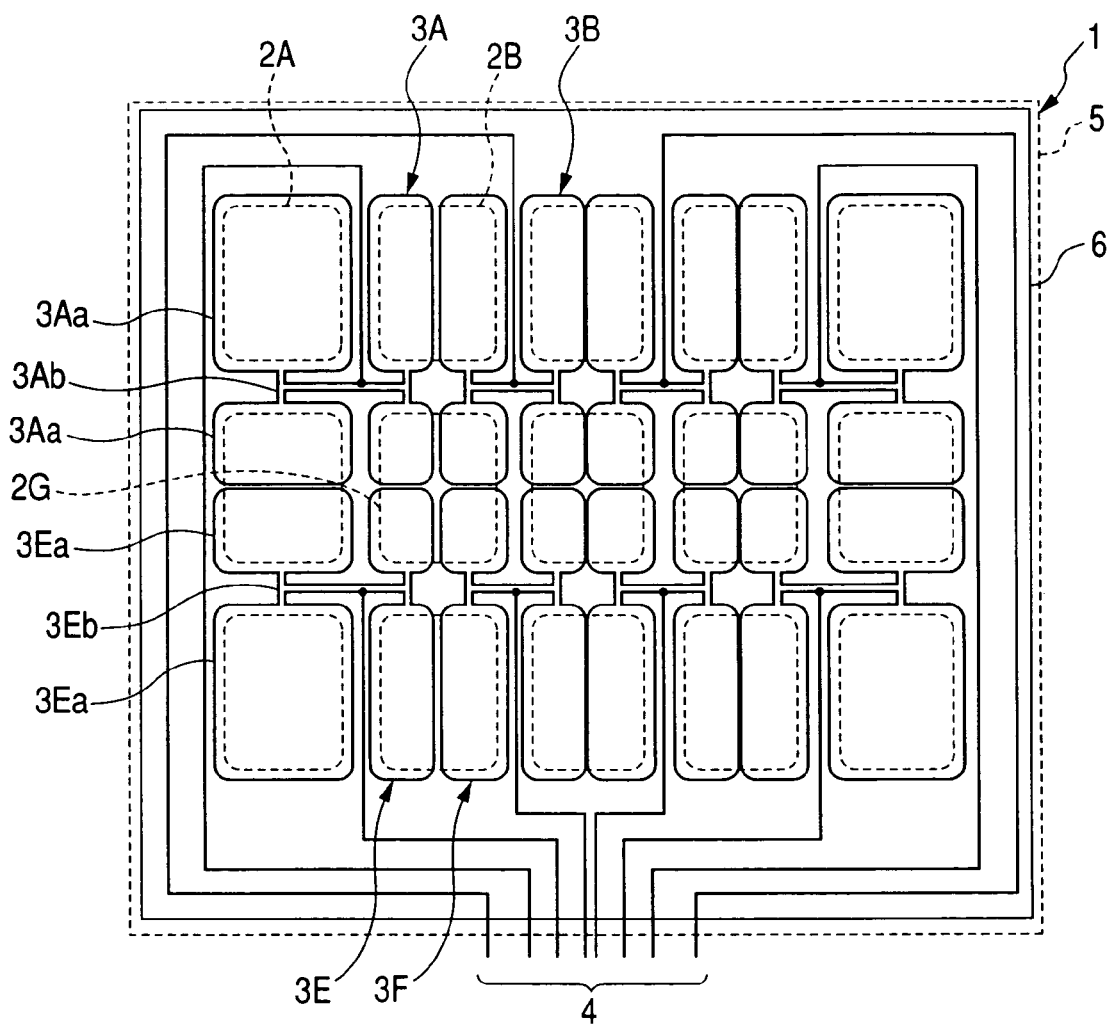
FIG. 3 is a front view showing another example of molded patterns of the electrodes and the conductive wires formed on the substrate when the input key of the input device of the invention is arranged.
Figure 4:
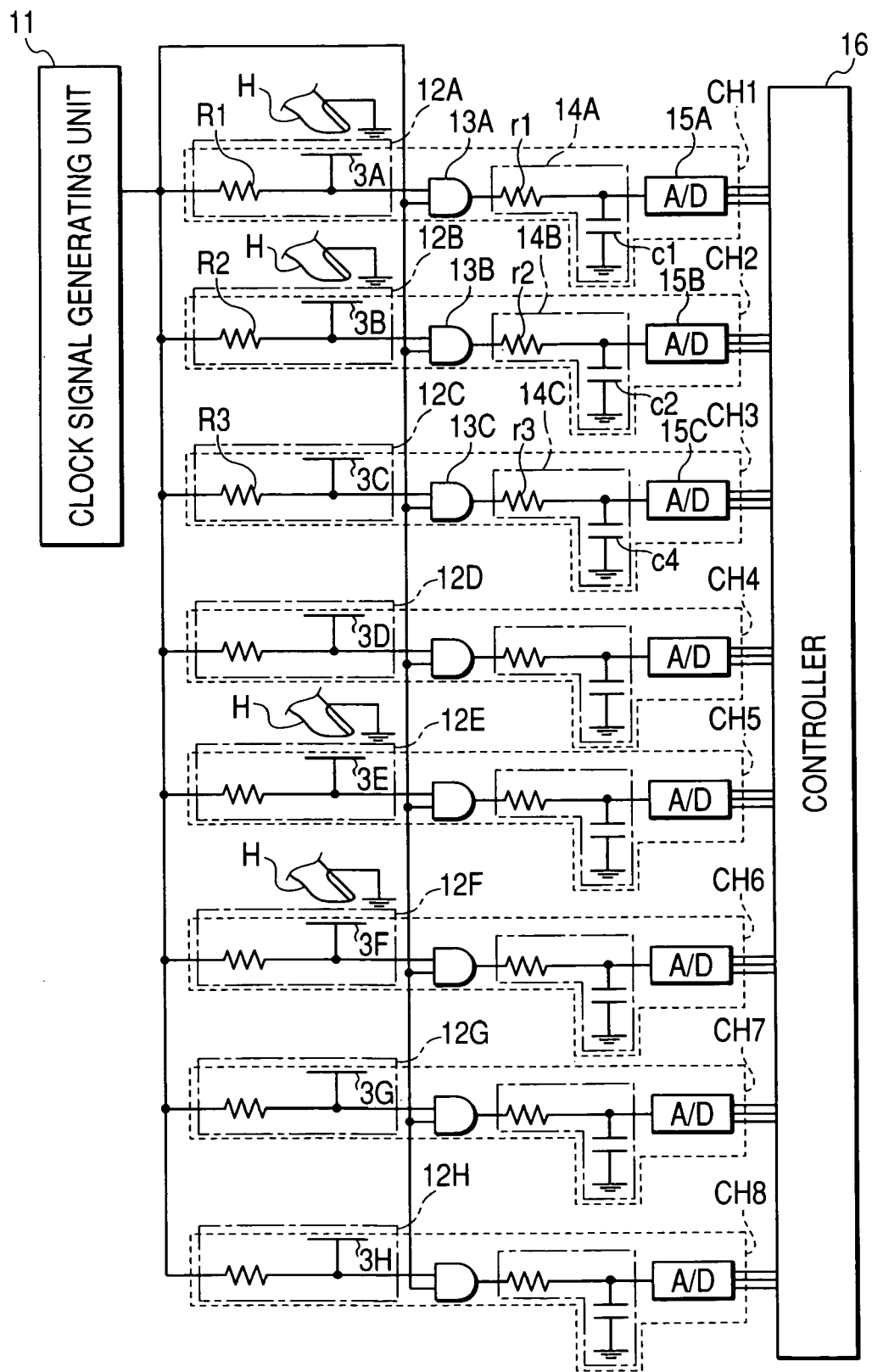
FIG. 4 is a circuit diagram showing an example of an input key detecting unit according to the present embodiment.

Here, FIGS. 1 to 5 will be described. FIG. 1 is a perspective view showing an example of an embodiment of an input device according to the invention. To be more specific, FIG. 1 is a view showing a top sheet, input keys, a substrate and electrodes interposed in a chassis of an electronics device having the input device. FIGS. 2 and 3 are front views showing examples of molded patterns of electrodes and conductive wires formed on a substrate when the input keys are arranged. That is, FIG. 2 illustrates electrodes that are formed in a rectangular shape, and FIG. 3 illustrates electrodes that are formed in a special shape matched with the shape of the input keys. In FIGS. 2 and 3, the electrodes and conductive wires are indicated by solid lines, and the top sheet and the input keys that are printed on the top sheet are indicated by dotted lines. FIG. 4 illustrates an example of the input key detecting unit according to the present embodiment. Here, since FIG. 4 illustrates a state in which a plurality of electrodes concurrently responds to operation of one input key, the operation state is illustrated by repeatedly describing one human body (finger) H. FIG. 5 shows graphs showing an example of the change in electrostatic capacitance of the electrodes.

As shown in FIG. 1, an input device 1 according to the present embodiment is the input device 1 for a computer, electronic calculator, PDA, and so forth. It is assumed that the input device 1 is disposed in chasses 10A and 10B. The input device 1 includes input keys 2 formed on a top sheet 5, electrodes 3 formed on a substrate 6, an input key detecting unit (not shown in FIG. 1) to be connected to the electrodes 3.

As shown in FIG. 1, the input keys 2 are printed on an external surface (to be in contact with a human body H) of the dielectric top sheet 5. Further, as shown in FIG. 2, the input keys 2 are arranged in a 3×5 matrix. Part numbers of the input keys 2 shown in FIGS. 2 and 3 are given in alphabetical order from left to right in the first row and then left to right in the second row and so on such as 2A, 2B, 2C, . . . 2N, 2O.

As shown in FIG. 1, the substrate 6 having the plurality of electrodes 3 is disposed in a position facing the top sheet 5, and the electrodes 3 are printed on a surface of the substrate 6 facing the top sheet. Further, as shown in FIG. 2, the electrodes 3 surround the intersections of rows and columns formed by the input keys 2 arranged in the 3×5 matrix and face parts of or all surfaces of the input keys 2. To be more specific about the above-described formed patterns, for example, the intersection of the rows formed by the input keys 2A and 2F and the columns formed by the input keys 2A and 2B is surrounded by the input keys 2A, 2B, 2F and 2G. The electrode 3A is formed so as to face the whole surface (2A) or partial surfaces (2B, 2F and 2G) of these input keys 2A, 2B, 2F and 2G. Further, electrodes 3 other than the electrode 3A are formed in the same manner as the electrode 3A. Part numbers of the electrodes 3 shown in FIGS. 2 and 3 are given in alphabetical order from left to right in the first row and then left to right in the second row and so on such as 3A, 3B, 3C, . . . 3G, 3H.

Here, the electrodes 3 are not limited to being formed in a rectangular shape on the substrate 6 as shown in FIG. 2. For example, as shown in FIG. 3, the electrodes 3 can be formed so as to have a plurality of touch sensitive parts 3Aa which is positively activated by a sense of the human body H and a plurality of non-touch sensitive parts 3Ab connecting the touch sensitive parts 3Aa. The touch sensitive parts 3Aa are formed in a rectangular shape, and the non-touch sensitive parts 3Ab are formed in a thin line shape so as to have a smaller area than the touch sensitive part 3Aa.

An input key detecting unit is connected to one end of each of the conductive lines 4 connected to the electrodes 3. The input key detecting unit identifies an operated input key among the input keys by combinations of the electrodes 3 having the change in electrostatic capacitance C. As shown in FIG. 4, the input key detecting unit is designed to have eight (the number of electrodes 3) detection channels CH, and a controller 16 connected to the respective detection channel CH. Each detection channel CH is composed of a clock signal generating unit 11, a delay unit 12, a logical conjunction unit 13, a smoothing unit 14, and an A/D conversion unit 15.

The clock signal generating unit 11 is designed to continuously output pulse signals composed of predetermined frequencies. One output terminal of the clock signal generating unit 11 is connected to an input terminal of the delay unit 12, and the other output terminal of the clock signal generating unit 11 is connected to an input terminal of the logical conjunction unit 13. In addition, the respective detection channels CH share the clock signal generating unit 11.

The delay unit 12 includes a resistor R and the above-described electrodes 3. The output terminal of the delay unit 12 is connected to the input terminal of the logical conjunction unit 13.

The logical conjunction unit 13 is formed by using an AND gate circuit. As described above, the two input terminals of the logical conjunction unit 13 are connected to the clock signal generating unit 11 and the delay unit 12 respectively. An output terminal of the logical conjunction unit 13 is connected to an input terminal of the smoothing unit 14.

The smoothing unit 14 connected to the output terminal of the logical conjunction unit 13 is formed by a smoothing circuit having a resistor r and a capacitor c. An output terminal of the smoothing unit 14 is connected to an input terminal of the A/D conversion unit 15.

The A/D conversion unit 15 connected to the smoothing unit 14 is formed by using an A/D converter. An output terminal of the A/D conversion unit 15 is connected to one of eight input terminals formed in the controller 16.

The controller 16, to which the respective channels CH are connected, includes a CPU (not shown) which performs computing. The controller 16 is designed to identify input keys that the human body H contacts or approaches out of the total fifteen input keys 2, corresponding to combinations of the respective detection channel CH that have detected change in electrostatic capacitance C of the electrodes 3.

Next, the operation of the input device 1 according to the present embodiment will be described.

The input device 1 of the present embodiment can detect specific input keys out of the fifteen input keys 2 by using detection patterns to be obtained from the eight electrodes 3. For example, when a part of the human body H such as finger or hand approaches or contacts the input key 2G in the second row and the second column out of the input keys 2A, 2B, . . . , 2N, 2O arranged in the 3×5 matrix, there is the change in electrostatic capacitance C of the respective four electrodes 3A, 3B, 3E and 3F partially facing the input key 2G. This is because one capacitor in which the human body H becomes an end of an electrode is formed by the respective four electrodes 3A, 3B, 3E and 3F, and the human body H. The electrostatic capacitance C changes depending on a facing area S and a facing distance d between the respective four electrodes 3A, 3B, 3E, and 3F, and the human body H. In general, the capacitance C can be obtained by an equation as follows.

$$C = \varepsilon \frac{S}{d} \qquad \text{[Number 1]}$$

Herein, e is a dielectric constant between the electrodes 3 and the human body H, S is a facing area between the electrode 3 and the human body H, and d is a facing distance between the electrode 3 and the human body H. The dielectric constant e is a total of a dielectric constant of the top sheet and a dielectric constant of air.

When the human body H approaches and contacts the four respective electrodes 3A, 3B, 3E and 3F, the facing distance between the electrodes 3A, 3B, 3E and 3F, and the human body H decreases. Therefore, the value of the electrostatic capacitance C of the respective electrodes 3A, 3B, 3E and 3F increases in accordance with Equation 1, since the facing area S between them increases. A time constant CR obtained by multiplying the resistor R provided in the delay unit 12 of the respective detection channel CH, to which the four respective electrodes 3A, 3B, 3E and 3F are connected, and the electrostatic capacitance C of the four electrodes 3A, 3B, 3E and 3F increases. For this reason, delay processing is performed on clock signals CK which are input to the delay unit 12 from the clock signal generating unit 11.

Here, with reference to the clock signals generated by the clock signal generating unit 11, clock signals Sa and Sb, on which the delay processing is performed in the other cases of electrostatic capacitance C, will be described with reference to FIGS. 5A and 5B.

When the human body H approaches the input key 2G, with respect to the increasing time constant CR of the time constant CR, the delay processing is performed on the clock signal Sa output from the delay unit 12, as shown in FIG. 5B, so that a rectangular wave (clock signal CK) is delayed to become a triangular wave (solid line). On the other hand, when the human body H goes away from the input key 2G, with respect to the decreasing time constant CR of the delay unit 12 in the equation 1, the clock signal Sb output from the delay unit 12 becomes a clock signal (one-dot chain line) of a substantially rectangular wave whose pulse width is narrower than that of the clock signal CK. In other words, the clock signals Sa and Sb to be obtained by the delay unit 12 distinctly vary depending on differences between the electrostatic capacitance C.

When the clock signal Sa with the high time constant CR of the delay unit 12 and the unprocessed clock signal CK are input to the logical conjunction unit 13, as shown in FIG. 5C, a rectangular pulse wave Pa, having a pulse width ta obtained on the basis of a threshold value TH, is output. In the meantime, when the clock signal Sb with the low time constant CR of the delay unit 12 and the unprocessed clock signal CK are input to the logical conjunction unit 13, a rectangular pulse wave Pb, having a pulse width tb obtained on the same basis, is output. A magnitude relationship between the pulse width ta of the pulse wave Pa and the pulse width tb of the pulse wave Pb becomes ta<tb. That is, when the time constant CR increases, the pulse width decreases so that the value of output voltage of analog signals to be obtained by the smoothing unit 14 decreases.

To be more specific, as shown in FIG. 5D, when the human body H approaches or contacts the input key 2G, a value of an output voltage of analog signals Aa becomes Va. On the other hand, when the human body H goes away from the input key 2G, a value of an output voltage of analog signals Ab becomes Vb that is larger than Va.

When a smoothed analog signal Aa or Ab is input to the A/D conversion unit 15, signals are detected with a predetermined sampling period, and then the analog signal Aa or Ab obtained by the smoothing unit 14 is converted to a digital signal Da or Db (not shown).

The digital signal Da or Db obtained by the A/D conversion unit 15 is transmitted to the controller 16. As the controller 16 detects whether the digital signal Da or Db exceeds a predetermined threshold value, it can be detected whether each electrode 3 responds to the human body H. In other words, digital signals, indicating that the human body H approaches the respective electrodes 3A, 3B, 3E and 3F, are input to the controller 16 from the respective channels CH1, CH2, CH5 and CH6 having the four electrodes 3A, 3B, 3E and 3F in which the electrostatic capacitance C is changed as the human body H approaches or contacts the input key 2G, and then the controller 16 combines detection results of the input digital signals. Therefore, it is possible to identify the input key 2G that the human body H approaches or contacts out of the plurality of input keys 2. For reference, the combinations of detection patterns according to the present embodiment are described in a table 1 as below.

TABLE 1

Corresponding relationship between input keys and electrodes.

| Input key | Electrode whose electrostatic capacitance is varied | | | |
|---|---|---|---|---|
| 2A | 3A | | | |
| 2B | 3A | 3B | | |
| 2C | 3B | 3C | | |
| 2D | 3C | 3D | | |
| 2E | 3D | | | |
| 2F | 3A | 3E | | |
| 2G | 3A | 3B | 3E | 3F |
| 2H | 3B | 3C | 3F | 3G |
| 2I | 3C | 3D | 3G | 3H |
| 2J | 3D | 3H | | |
| 2K | 3E | | | |
| 2L | 3E | 3F | | |
| 2M | 3F | 3G | | |
| 2N | 3G | 3H | | |
| 2O | 3H | | | |

That is, the present embodiment enables the input device 1 to have a fewer number of the electrodes 3 than the number of the input keys 2. The present embodiment is very beneficial when applied to make slim portable equipment having the input device 1 such as PDA, mobile phone or the like.

In addition, as shown in FIG. 3, it is possible to prevent malfunctions of the input device 1 due to an unintended key input since the respective electrodes 3 have the plurality of touch sensitive parts 3Aa formed in a rectangular shape and the plurality of non-touch sensitive parts 3Ab formed in a thin line shape. Since the non-touch sensitive parts 3Ab, facing other faces than operable faces of the input keys 2, have a smaller area than the touch sensitive part 3Aa, the change in the time constant CR of the delay unit 12 decreases. Therefore, the controller 16 cannot detect the human body H's approach or contact to the input keys.

The application of the invention is not limited to the above-described embodiment, and it can be modified in various forms within the idea of the invention if needed. For example, even though the input keys 2 are arranged in the 3×5 matrix in the present embodiment, the input keys 2 can be arranged in a matrix having 3 or more rows and 3 or more columns.

The invention claimed is:

1. An input device comprising:
 a plurality of input keys arranged in a matrix of three or more rows and three or more columns;
 electrodes facing some or all of surfaces of the input keys that surround intersections of rows and columns formed by the arrangement of the input keys; and
 an input key detecting unit that identifies operated input keys among the plurality of input keys depending on combinations of the electrodes having a change in electrostatic capacitance.

2. The input device according to claim 1,
 wherein the input key detecting unit includes a clock signal generating unit that generates clock signals; a delay unit that performs delay processing on the clock signals according to the electrostatic capacitance of the electrodes when a human body approaches or contacts the input keys; a logical conjunction unit that inputs delayed clock signals and non-delayed clock signals and outputs output signals according to a delayed amount of the delayed clock signals; a smoothing unit that smoothes the output signals of the logical conjunction unit such that the output signals become analog signals; an A/D conversion unit that converts the analog signals to digital signals; and a controller that identifies the input keys, which human body approaches or contacts, by combinations of the digital signals.

3. The input device according to claim 1,
 wherein the electrodes have non-touch sensitive parts, which do not respond to operation of the input keys, in positions not facing the input keys.

* * * * *